(12) United States Patent
Chua et al.

(10) Patent No.: US 6,831,021 B2
(45) Date of Patent: Dec. 14, 2004

(54) PLASMA METHOD AND APPARATUS FOR PROCESSING A SUBSTRATE

(75) Inventors: Tal Cheng Chua, San Jose, CA (US); Philip Allan Kraus, San Jose, CA (US); John Holland, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 10/461,083

(22) Filed: Jun. 12, 2003

(65) Prior Publication Data

US 2004/0038486 A1 Feb. 26, 2004

Related U.S. Application Data

(63) Continuation-in-part of application No. 10/170,925, filed on Jun. 12, 2002, now Pat. No. 6,660,659.
(60) Provisional application No. 60/395,677, filed on Jul. 12, 2002.

(51) Int. Cl.[7] ................ H01L 21/469; H01L 21/425
(52) U.S. Cl. ........................ 438/776; 427/579
(58) Field of Search .................. 438/585, 591, 438/765, 769, 775, 776, 777; 427/569, 578, 579

(56) References Cited

U.S. PATENT DOCUMENTS

| | | | |
|---|---|---|---|
| 5,020,411 A | * 6/1991 | Rowan | 89/1.11 |
| 6,541,294 B1 | * 4/2003 | Yamazaki et al. | 438/29 |
| 6,664,145 B1 | * 12/2003 | Yamazaki et al. | 438/149 |

* cited by examiner

Primary Examiner—Evan Pert
Assistant Examiner—Monica D. Harrison
(74) Attorney, Agent, or Firm—Blakely Sokoloff Taylor & Zafman

(57) ABSTRACT

Embodiments of the invention generally provide a method of forming a nitride gate dielectric layer. The method includes generating a nitrogen-containing plasma in a processing chamber via introduction of a nitrogen-containing processing gas into the processing chamber and the application of an ionizing energy to the processing gas, and pulsing the ionizing energy to maintain a mean temperature of electrons in the nitrogen-containing plasma of less than about 0.7 eV.

7 Claims, 18 Drawing Sheets

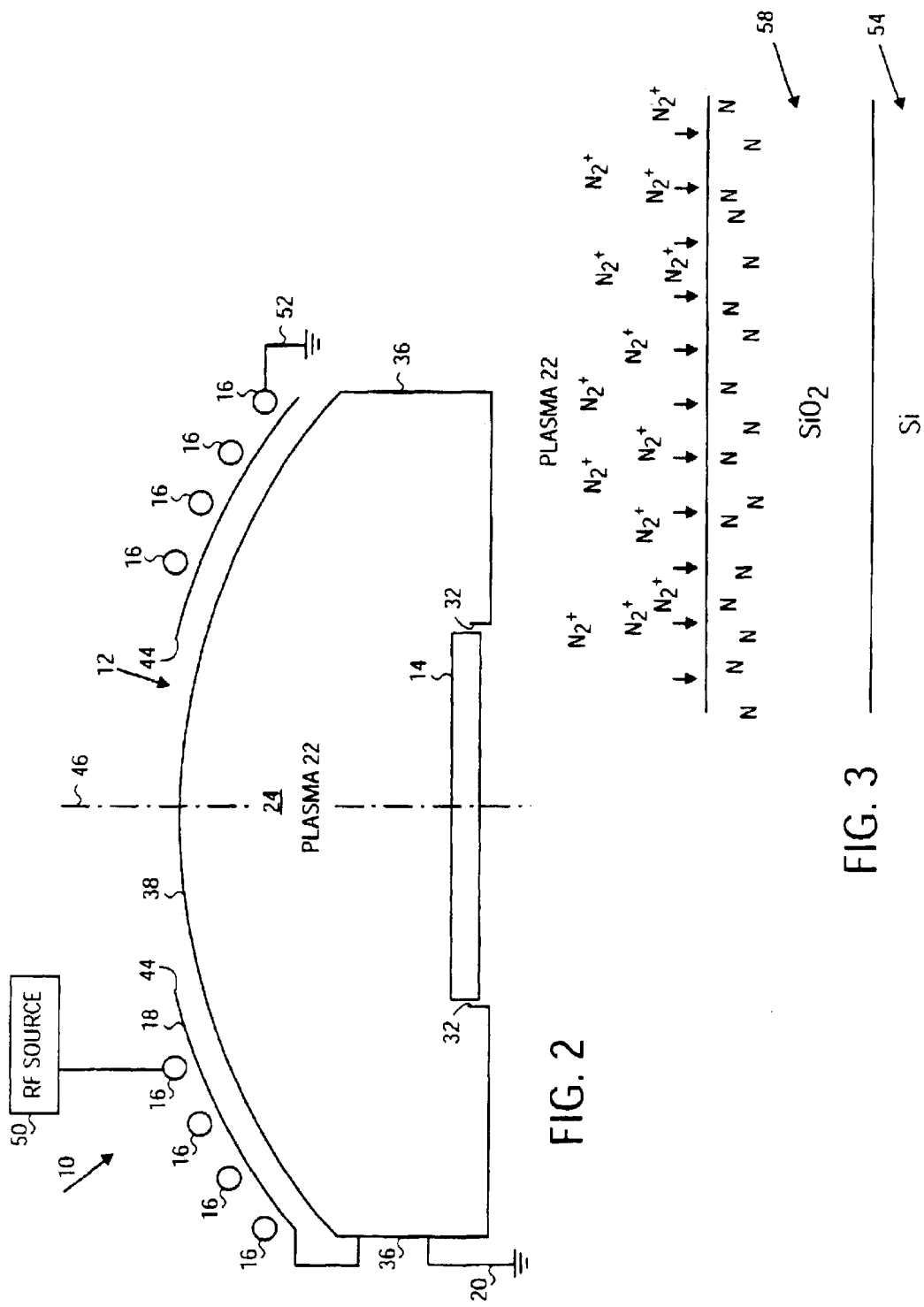

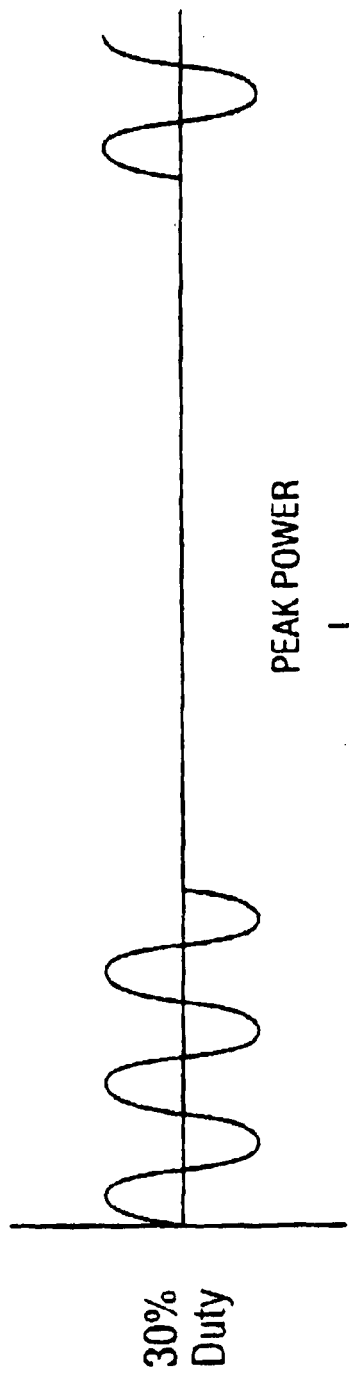
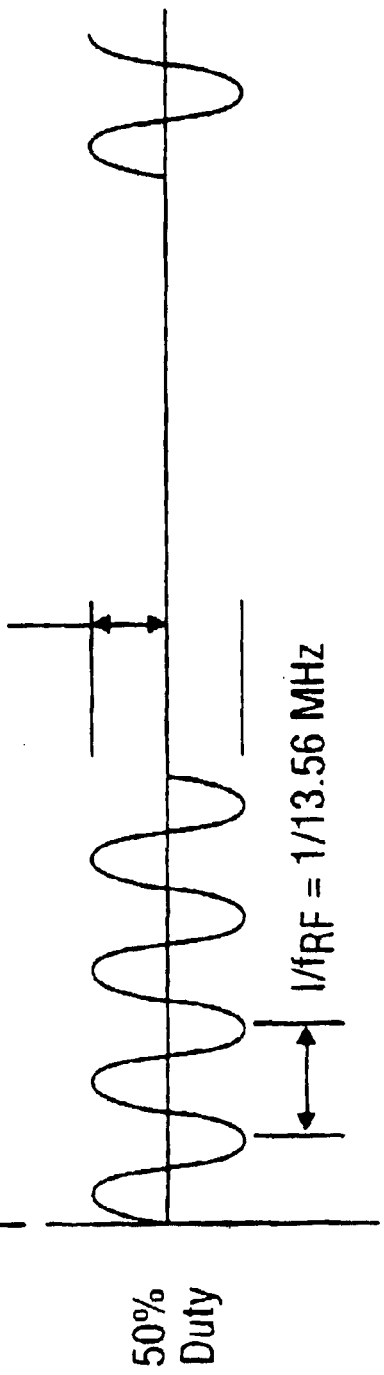
FIG. 11
FIG. 12

PLASMA METHOD AND APPARATUS FOR PROCESSING A SUBSTRATE

CROSS-REFERENCE TO RELATED APPLICATIONS

The present patent application is a continuation-in-part of prior U.S. patent application Ser. No. 10/170,925, filed on Jun. 12, 2002 now U.S. Pat. No. 6,660,659, and claims priority from provisional patent application No. 60/395,677, filed on Jul. 12, 2002, both of which are incorporated herein by reference in their entirety.

BACKGROUND OF THE INVENTION

1) Field of the Invention

This invention generally relates to a plasma reactor and a method of processing a substrate with a plasma generated in the reactor. More particularly, the invention relates to utilizing a pulsed plasma processing apparatus and method configured to generate a plasma having a lower temperature than conventional plasma processing reactors.

2) Discussion of Related Art

The manufacture of integrated circuits involves the manufacture of field effect transistors in and on silicon or other semiconductor substrates. The manufacture of a field effect transistor includes the formation of a gate dielectric layer. The dielectric layer is typically grown by exposing silicon of the substrate to oxygen, thereby forming silicon dioxide gate dielectric layers.

As logic devices have become smaller, it has become advantageous to include nitrogen into the silicon dioxide gate dielectric layers. Nitrogen is often incorporated by creating a plasma of nitrogen ions within a chamber and implanting the nitrogen ions into the gate dielectric layer. The plasma is typically created utilizing a radio frequency (RF) source, with either an electrode plate (capacitative coupling) or a coil (inductive coupling). The RF source creates an RF field within a gas in the chamber, and this coupling creates the plasma.

Independent of the type of RF source (plate or coil), there can be significant capacitative coupling from the source to the plasma, which creates a relatively large plasma potential, on the order of tens of volts. Such a large plasma potential may cause excessive bombardment of the silicon dioxide layer with nitrogen ions, which can cause damage to the silicon dioxide layer and even incorporation of nitrogen into the underlying silicon. Damage to the silicon dioxide layer or incorporation of nitrogen into the underlying silicon diminishes the advantages of nitrogen incorporation.

SUMMARY OF THE INVENTION

According to one aspect of the invention, a method is provided of processing a substrate, including locating the substrate in a processing chamber, creating a nitrogen plasma in the chamber, the plasma having an ion density of at least $10^{10}$ cm$^{-3}$, and a potential of less than 20 V, and exposing a layer on the substrate to the plasma to incorporate nitrogen from the plasma into the layer.

According to another aspect of the invention, a method of processing a substrate is provided, wherein the substrate is located in a plasma processing chamber, a nitrogen-containing gas flows into the chamber, an RF current is provided through a coil to generate an RF field in the chamber, the RF field creating a nitrogen-containing RF plasma out of the gas, the RF current being pulsed, and incorporating nitrogen ions and excited neutrals from the plasma into a gate dielectric layer formed on the substrate.

According to a further aspect of the invention, a plasma reactor is provided, including a chamber having an opening to transfer a substrate into an internal volume of the chamber, a substrate holder in the chamber for holding the substrate, an RF coil externally and adjacent to a wall of the chamber, and a grounded electrode plate between the wall and the RF coil.

Embodiments of the invention further provide a method of forming a nitride gate dielectric layer. The method includes generating a nitrogen-containing plasma in a processing chamber via introduction of a nitrogen-containing processing gas into the processing chamber and the application of an ionizing energy to the processing gas, and pulsing the ionizing energy to maintain a mean temperature of electrons in the nitrogen-containing plasma of less than about 0.7 eV.

Embodiments of the invention further provide a method of controlling a mean energy of constituents of a nitrogen-containing plasma used to nitridate a gate dielectric layer, comprising pulsing an ionizing source used to maintain the nitrogen-containing plasma for a first duration sufficient to energize the nitrogen-containing plasma and turning off the ionizing source and allowing the constituents of the nitrogen-containing plasma to dissipate for a second duration, the second duration being longer than the first duration, and the second duration being calculated to generate a mean energy of the constituents of a nitrogen-containing plasma of less than about 0.7 eV.

BRIEF DESCRIPTION OF THE DRAWINGS

The invention is further described by way of examples with reference to the accompanying drawings, wherein:

FIG. 2 is a cross-sectional side view of upper components of the plasma reactor;

FIG. 3 is a cross-sectional side view illustrating nitrogen ion incorporation into a silicon dioxide gate dielectric layer;

FIG. 11 is a graph illustrating pulsing of RF power to an RF coil with a 30% duty cycle;

FIG. 12 is a graph similar to FIG. 11 at a 50% duty cycle;

DETAILED DESCRIPTION OF THE INVENTION

Figure 1:
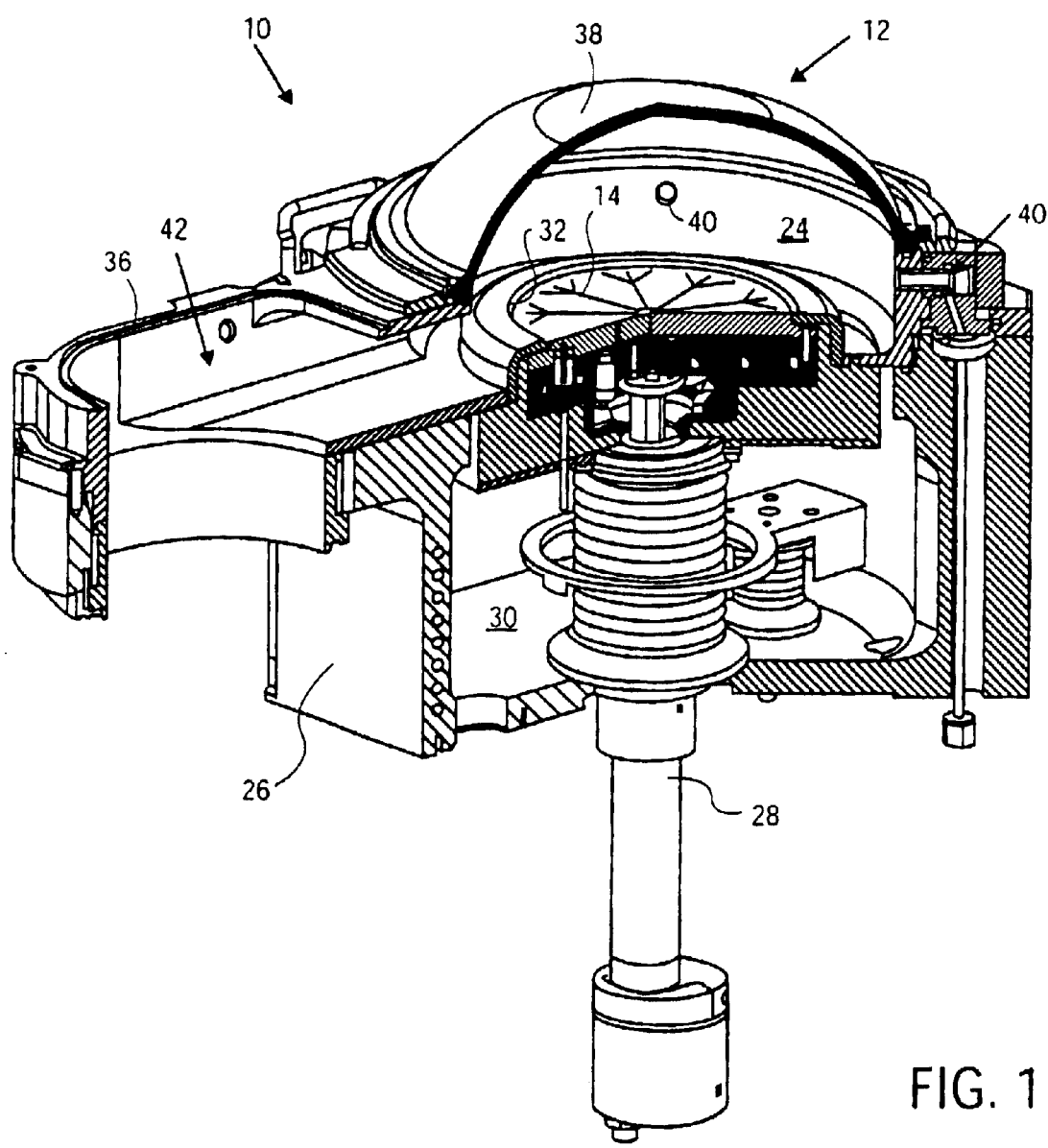
FIG. 1 is a perspective view of a plasma reactor according to an embodiment of the invention.

FIGS. 1 and 2 illustrate a plasma reactor 10, according to an embodiment of the invention, including a chamber 12, a substrate holder 14, an RF coil 16, and an electrode plate 18. The electrode plate 18 is connected through a body of the chamber 12 to ground 20. By grounding the electrode plate 18, a capacitive coupling between the RF coil 16 and a plasma 22 in an internal volume 24 of the chamber 12 is eliminated. The elimination of the capacitive couple reduces the potential of the plasma 22 without dramatically altering other properties of the plasma 22, such as ion density and electron density. The inductive coupling from the RF coil 16 is not eliminated, and this coupling creates and maintains the plasma 22.

Referring specifically to FIG. 1, the plasma reactor 10 further includes a lower transfer chamber 26 and a transfer mechanism 28. The chamber 12 is positioned on top of the transfer chamber 26. An internal volume 30 of the transfer chamber 26 is placed in communication with the internal volume 24 of the chamber 12 through a circular opening 32 in a base of the chamber 12. The substrate holder 14 is secured on top of the transfer mechanism 28, and the transfer mechanism 28 can be used to elevate or lower the substrate holder 14.

In use, the transfer mechanism 28 is operated so that the substrate holder 14 is lowered into the internal volume 30 of the transfer chamber 26. A wafer substrate, positioned on a blade attached to a robot arm, is then transferred through a slit-valve opening in a wall of the transfer chamber 26 into the internal volume 30. The transfer mechanism 28 is then operated to elevate the substrate holder 14 so that the substrate holder 14 contacts a lower surface of the wafer substrate and elevates the wafer substrate off the blade. The blade is then removed from the transfer chamber 26, whereafter the transfer mechanism 28 is again operated to elevate the substrate holder 14 into the opening 32. The wafer substrate, located on the substrate holder 14, then has an upper surface which is exposed to the internal volume 24 of the chamber 12.

The chamber 12 includes primarily a conductive body 36 and a dielectric quartz upper wall 38. The conductive body 36 forms a lower portion of the chamber 12, and the upper wall 38 forms an upper portion of the chamber 12. The conductive body 36 and the upper wall 38 jointly define the internal volume 24.

Four gas nozzle ports 40 are formed through the conductive body 36 into the internal volume 24. The gas nozzle ports 40 are positioned at 90° intervals around the substrate holder 14. The conductive body 36 also defines a vacuum pumping channel 42 on one side thereof. The gas nozzle ports 40 are connected through valves to a gas manifold, and the vacuum pumping channel 42 is connected to a pump. When the pump is operated, gases are extracted from the internal volume 24 through the vacuum pumping channel 42 to reduce a pressure within the internal volume 24. The valves can be operated to allow gases from the manifold through the valves and the gas nozzle ports 40 into the internal volume 24.

Referring more specifically to FIG. 2, the upper wall 38 has a dome shape, and the electrode plate 18 has a dome shape that conforms to an outer surface of the upper wall 38. The electrode plate 18 is in fact located directly on the upper wall 38. The electrode plate 18 defines a circular opening 44 over a center of the upper wall 38. The upper wall 38 and the electrode plate 18 are symmetrical around a vertical axis 46.

The coil 16 spirals around the vertical axis 46 and the opening 44. The coil 16 is positioned on and conforms to the dome shape of the electrode plate 18. One end of the coil 16 is connected to an RF source 50, and an opposing end of the coil 16 is connected to ground 52.

Reference is now made to FIGS. 2 and 3 in combination. An epitaxial silicon layer 54 is formed on an upper surface of a wafer substrate before the wafer substrate is inserted into the plasma reactor 10 positioned on an upper surface of the substrate holder 14. A thin silicon dioxide layer 58 is grown on the silicon layer 54, also before the wafer substrate is inserted into the plasma reactor 10. The silicon dioxide layer 58 is on the order of a few angstroms (e.g., 40 Å) thick, and is later used as a gate dielectric layer in a finally manufactured transistor. The purpose of inserting the wafer substrate into the plasma reactor 10 is to incorporate nitrogen (N) into the silicon dioxide layer 58 for purposes of modifying or improving its dielectric properties. The plasma 22 of nitrogen ions ($N_2+$) is created within the internal volume 24. The nitrogen ions have energies defined by the properties of the plasma which leads to their being incorporated into the silicon dioxide layer 58.

The plasma is created by first reducing the pressure within the internal volume 24 to a predetermined level. A nitrogen-containing gas is then introduced into the internal volume 24. The nitrogen-containing gas may, for example, be pure nitrogen ($N_2$), a mixture of nitrogen and helium gases ($N_2$/He), a mixture of nitrogen and neon gases ($N_2$/Ne), or a mixture of nitrogen and argon gases ($N_2$/Ar). For purposes of further discussion, examples are given where the gas is pure nitrogen gas.

The RF source 50 is then operated to provide RF current to the coil 16 at a frequency of 13.56 MHz. The RF coil 16 generates an RF field which is spread by the electrode plate 18 across the upper wall 38. The circular opening 44 permits the RF field to enter through the upper wall 38 into the internal volume 24. The RF field then couples with the nitrogen gas in the internal volume 24. The RF field initially excites a small number of free electrons. The free electrons then collide with other atoms to release more electrons from these atoms. The process is continued until a steady-state condition is achieved, where the plasma 22 has a steady amount of free electrons and free ions, a steady electron temperature, and a constant voltage relative to ground. A "reservoir" of ions is so created within the internal volume 24, and the voltage potential of the plasma 22 assists in incorporating ions from this reservoir into the silicon dioxide layer 58. The potential of the substrate and the substrate holder 14 float freely during the entire process, but there is a difference in the voltage of the plasma 22 and that of the substrate holder 14, the difference driving the incorporation of the ions. The difference is proportional to the instantaneous electron temperature, and the nitrogen incorporation is driven by the time-averaged electron temperature. Reference herein to "electron temperature" should be understood to mean "time-averaged electron temperature" over many (e.g., thousands) of cycles of pulsing.

Without grounding the electrode plate 18, the RF coil 16 couples capacitively to the plasma 22. Such a capacitive couple between the RF coil 16 and the plasma 22 increases the voltage of the plasma 22. Conversely, by grounding the electrode plate 18, the capacitive coupling is substantially reduced, and the voltage of the plasma 22 is reduced. The plasma potential and the electron temperature are reduced, but ion density remains relatively high. To prevent excessive incorporation of nitrogen through the $SiO_2$ and into the silicon substrate, plasma potential is preferably less than 10 V. Electron temperatures are preferably near or less than 2 eV. Ion density is preferably at least $10^{10}$ $cm^{-3}$.

Figure 4:
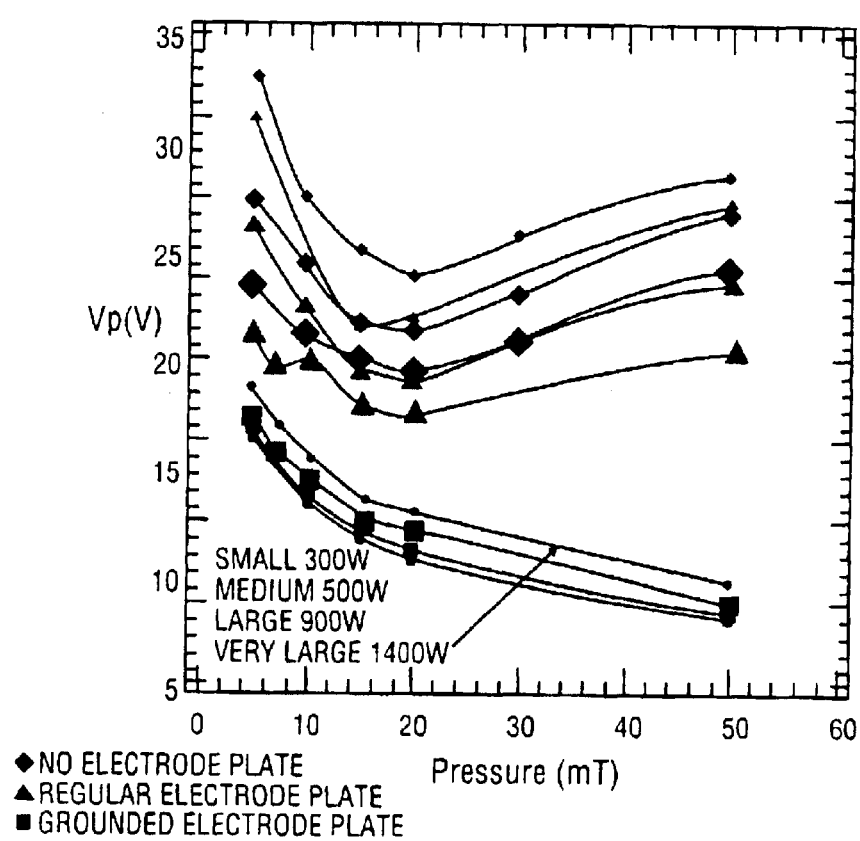
FIG. 4 is a graph illustrating plasma potential as a function of pressure for various RF source powers and electrode plate configuration as measured with a Langmuir probe.

FIG. 4 illustrates experimental results utilizing no electrode plate, a regular ungrounded electrode plate, and a grounded electrode plate, respectively. In each case, experimental results were obtained when applying 300 W, 500 W, and 900 W of power to the RF coil 16. Larger blocks or triangles indicate larger power magnitudes. At a given power provided to the RF coil 16, the plasma voltage (Vp) is the smallest for a grounded electrode plate, higher for an ungrounded electrode plate, and even higher when there is no electrode plate. In other examples, effective RF power supplied to the RF coil 16 may be between 160 and 3000 W. Potentials below 10 V are not achievable without the grounded electrode plate. What should also be noted is that the potentials do not substantially increase with an increase in power provided to the RF coil. Even very large power magnitudes above 1000 W (e.g., 1400 W), create plasma voltages below 20 V at pressures above 5 milliTorr (mT), and plasma voltages below 10 V at pressures above 40 mT.

Figure 5:
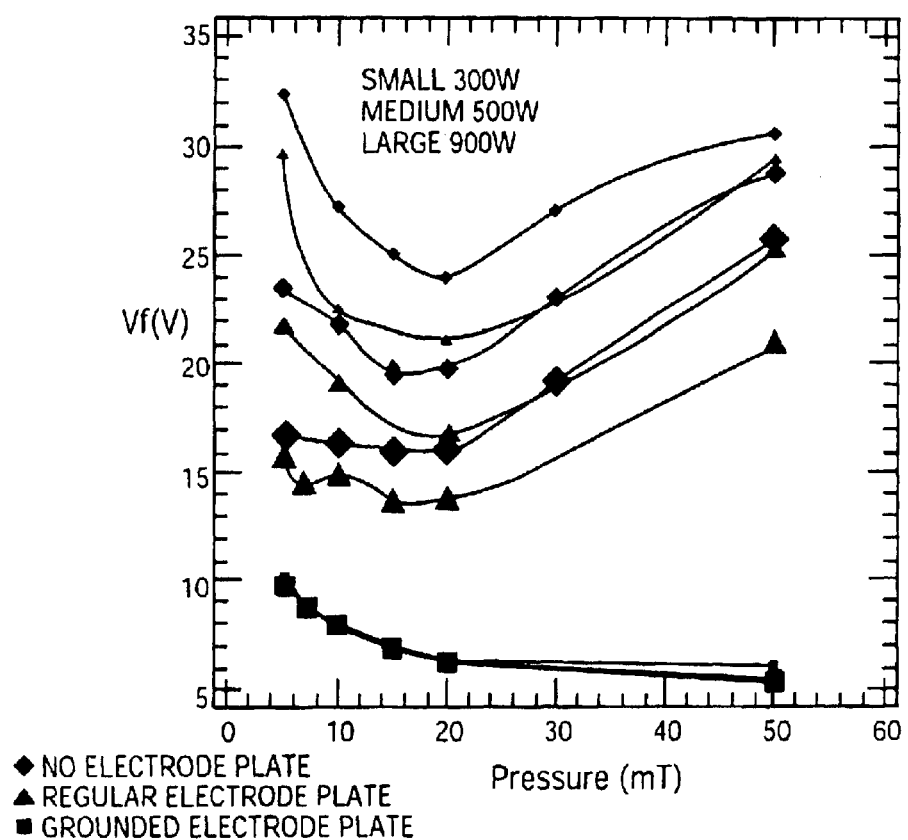
FIG. 5 is a graph illustrating the floating voltages as a function of pressure for the electrode plate configuration as measured with a Langmuir probe.

FIG. 5 illustrates the floating voltage of the plasma for the condition of FIG. 4. The potential at which the wafer resides is at or near Vf. Again, it can be seen that the substrate voltage (Vs) is the smallest for a grounded electrode plate, higher for an ungrounded electrode plate, and even higher when there is no electrode plate.

Figure 6:
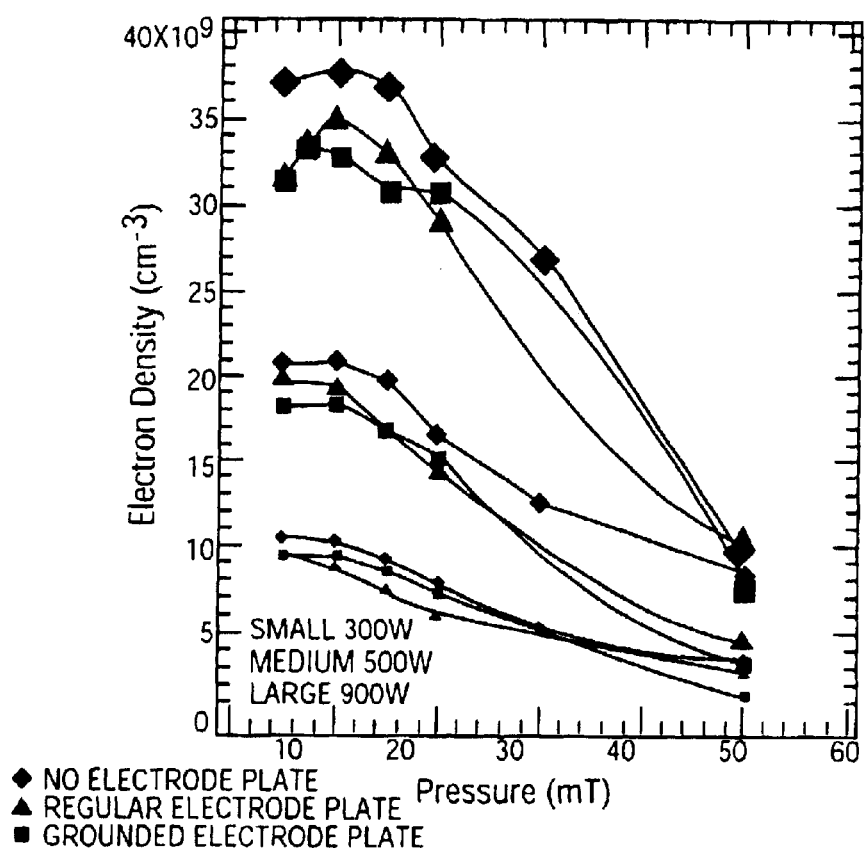
FIG. 6 is a graph illustrating electron density as a function of pressure for the electrode plate configuration as measured with a Langmuir probe.
Figure 7:
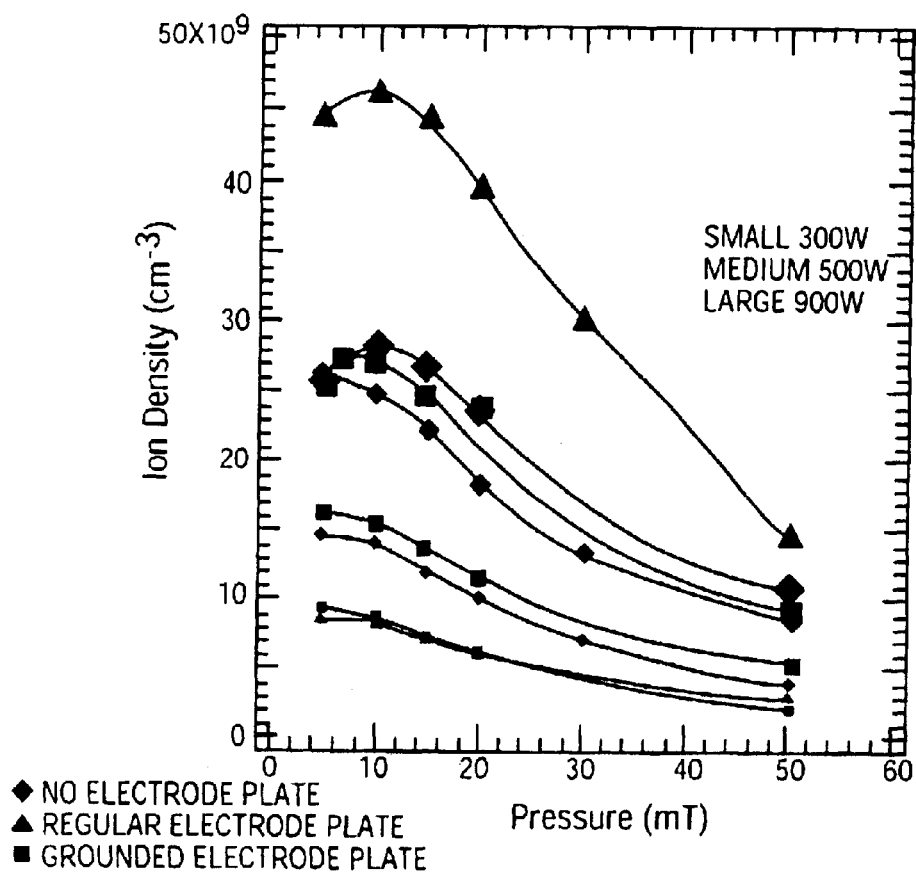
FIG. 7 is a graph illustrating ion density as a function of pressure for the electrode plate configuration as measured with a Langmuir probe.

FIGS. 6 and 7 illustrate electron density and ion density, respectively. For a given magnitude of power applied to the RF coil 16, there is very little difference between the electron density (or the ion density), when using a grounded electrode plate and when using an ungrounded electrode plate. Although not shown, ion densities above $50 \times 10^9$ cm-3 are achievable when RF power above 1000 W is provided to the RF coil.

Figure 8:
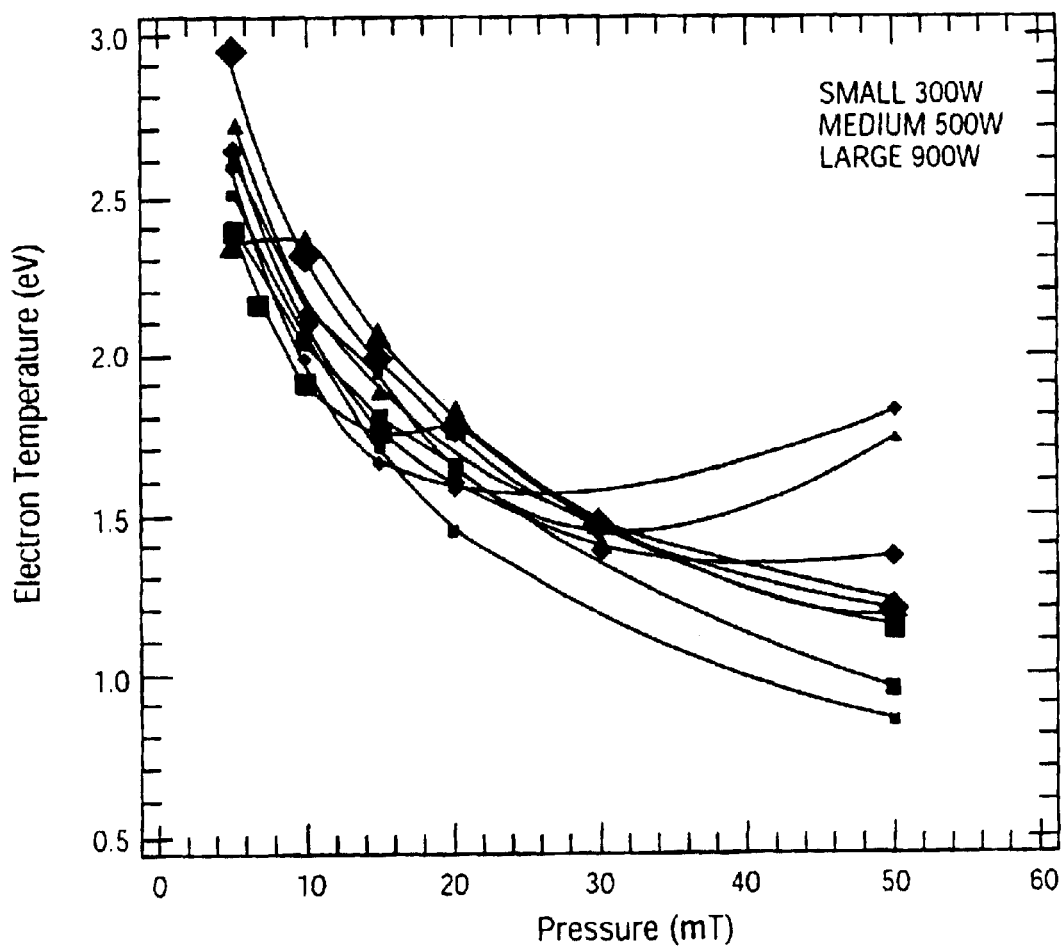
FIG. 8 is a graph illustrating electron temperature as a function of pressure for the electrode plate configuration as measured with a Langmuir probe.

FIG. 8 illustrates electron temperature. It can be seen that at lower pressures there is relatively little difference in electron temperatures when using a grounded, ungrounded, or no electrode plate. However, at higher pressures, typically above 40 mT, it can be seen that electron temperature is much higher when an ungrounded electrode plate is used, or when no electrode plate is used, than when a grounded electrode plate is used.

Figure 9:
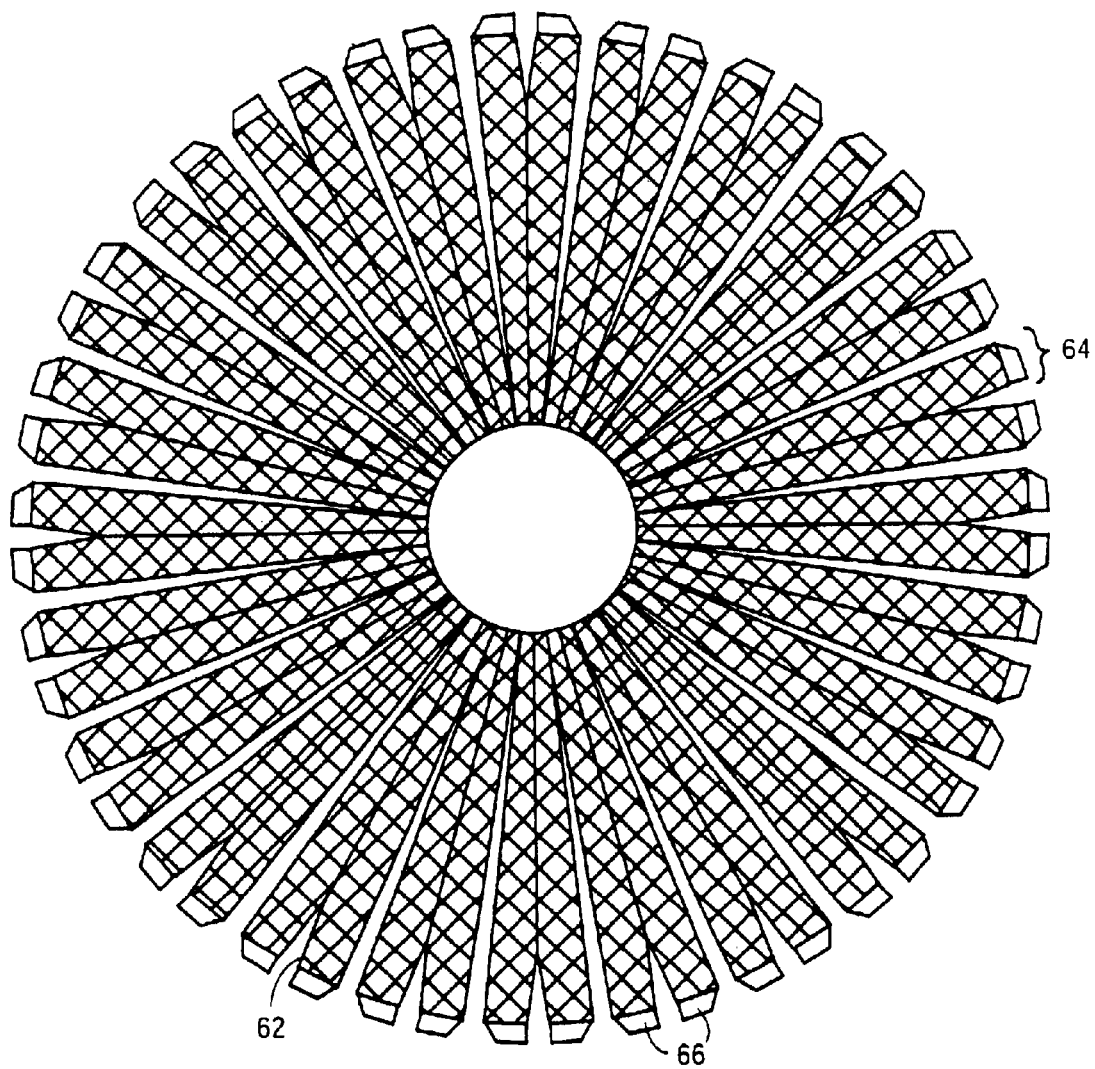
FIG. 9 is a bottom view of laminate, including an electrode plate, according to an embodiment of the invention.
Figure 10:
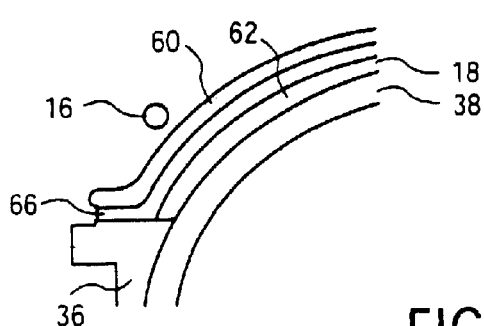
FIG. 10 is a cross-sectional side view illustrating the laminate in an installed position.

Referring to FIGS. 9 and 10, the electrode plate 18 is laminated between two dielectric sheets 60 and 62. The electrode plate 18 and the dielectric sheets 60 and 62 are formed in strips 64 that, when folded toward one another, collectively define a dome shape. The dielectric sheet 60 is positioned at the top between the electrode plate 18 and the RF coil 16. The dielectric sheet 62 is located between the electrode plate 18 and the upper wall 38. Ends of the electrode plate are not covered by the dielectric sheet 62, to leave exposed lands 66. The exposed lands 66 contact a conductive portion of the conductive body 36, to ground the electrode plate 18 to the conductive body 36. The lands 66 are disposed on a perimeter of the electrode plate 18, so that the electrode plate 18 is peripherally grounded. Peripheral grounding of the electrode plate 18 ensures that the entire electrode plate 18 is as close to zero volts as possible.

The plasma voltage can also be reduced by pulsing the RF power provided to the RF coil 16. In the examples that are now provided, the electrode plate 18 was not grounded, although it should be understood that the electrode plate 18 may be grounded in addition to pulsing of the RF power provided to the RF coil 16.

As illustrated in FIGS. 11 and 12, RF power having a frequency of 13.56 MHz and a predetermined peak power is provided to the RF coil 16. The RF power may be automatically switched on and off, i.e., "pulsed." In the examples that are provided, the RF power is automatically pulsed at a frequency of 10 kHz. In other examples, the RF power may be pulsed at frequencies between 1 kHz and 100 kHz. The composition of the nitrogen plasma is continuously varied by varying the RF current between high and low states. In FIG. 11, the duty cycle, i.e., the total amount of time that the RF power is on, is 30%, and in FIG. 12, the duty cycle is 50%. The RF source 50 is pulsing-enabled, and both the pulsing frequency and duty cycle are manually adjustable. The effective delivered power is the peak power times the duty cycle. In other examples, the duty cycle may be between 10% and 90%. In the given example, the amplitude of the RF power is continually altered between 0% and 100%, but in another example, the amplitude may, for example, be altered between 10% and 100%.

Figure 13:
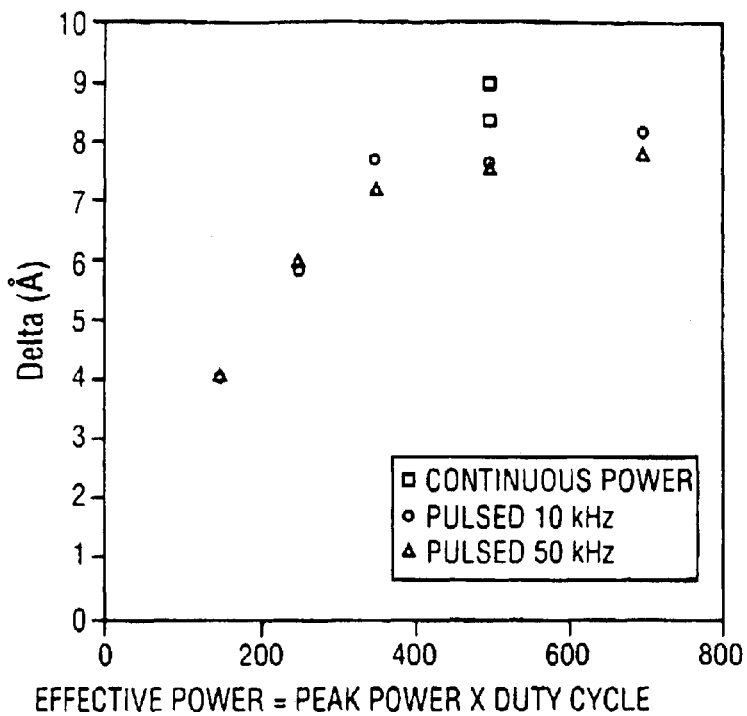
FIG. 13 is a graph illustrating thickness change before and after nitrogen plasma treatment with pulsed RF power, and provides a measure of incorporated nitrogen.

One way to measure incorporation of nitrogen is by measuring the thickness change ("optical delta") before and after a nitrogen plasma treatment. A larger thickness change indicates more nitrogen incorporation. As shown in FIG. 13, the amount of incorporated nitrogen using continuous power can also be achieved using pulsed power, with the amount of incorporated nitrogen scaling approximately with the effective delivered power. The change in optical thickness is relatively insensitive to pulsing frequency.

Figure 14:
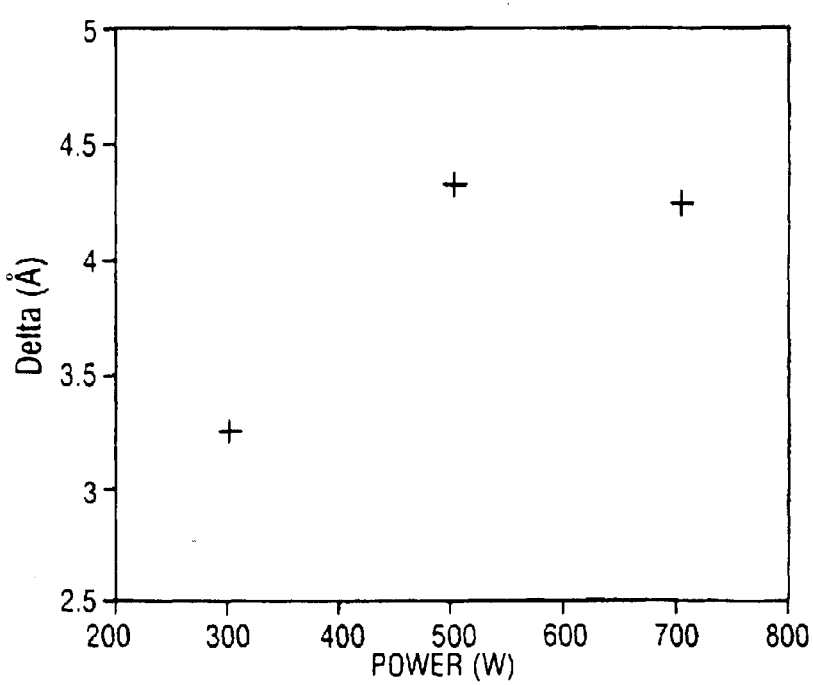
FIG. 14 is a graph illustrating thickness change for different samples processed at different continuous RF power settings.

FIG. 14 illustrates optical delta for samples prepared with continuous RF source power; the saturation in incorporated nitrogen with power is observed for both pulsed and continuous power.

Figure 15:
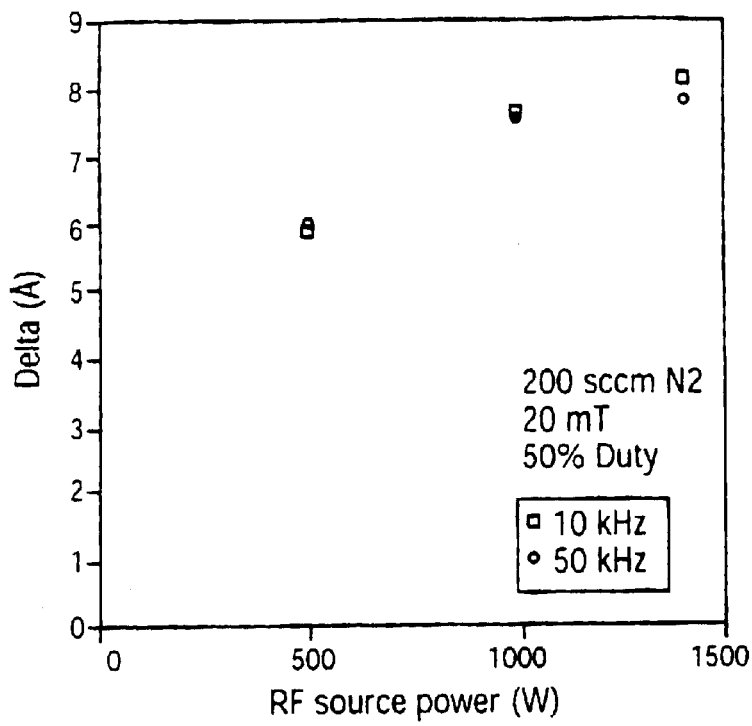
FIG. 15 is a graph illustrating thickness change as a function of RF source peak power for two pulsing frequencies.
Figure 16:
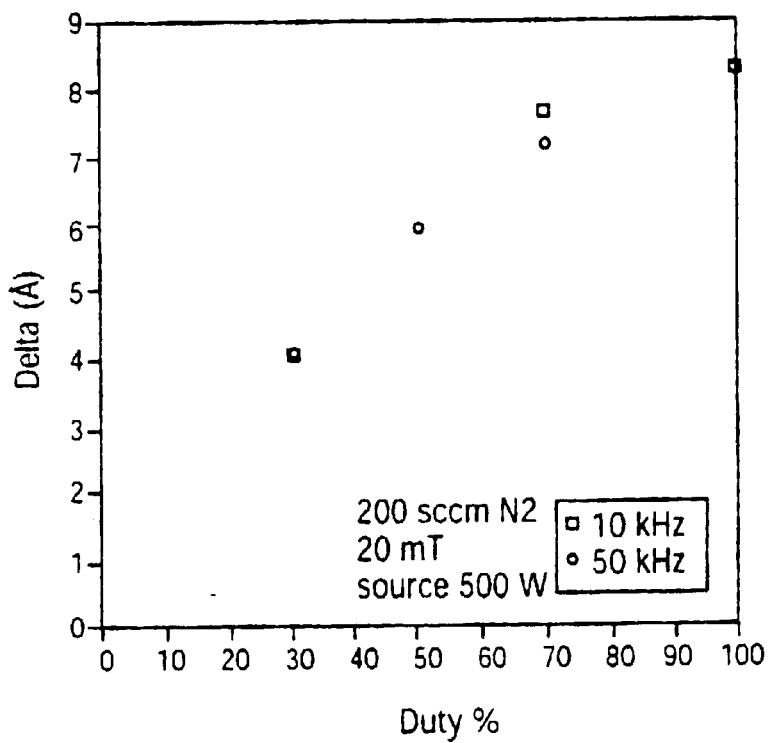
FIG. 16 is a graph illustrating thickness change as a function of duty cycles for two pulsing frequencies.

FIGS. 15 and 16 show the same data as in FIG. 13, plotted against source power and duty cycle, showing the same trends as FIG. 13.

Figure 17:
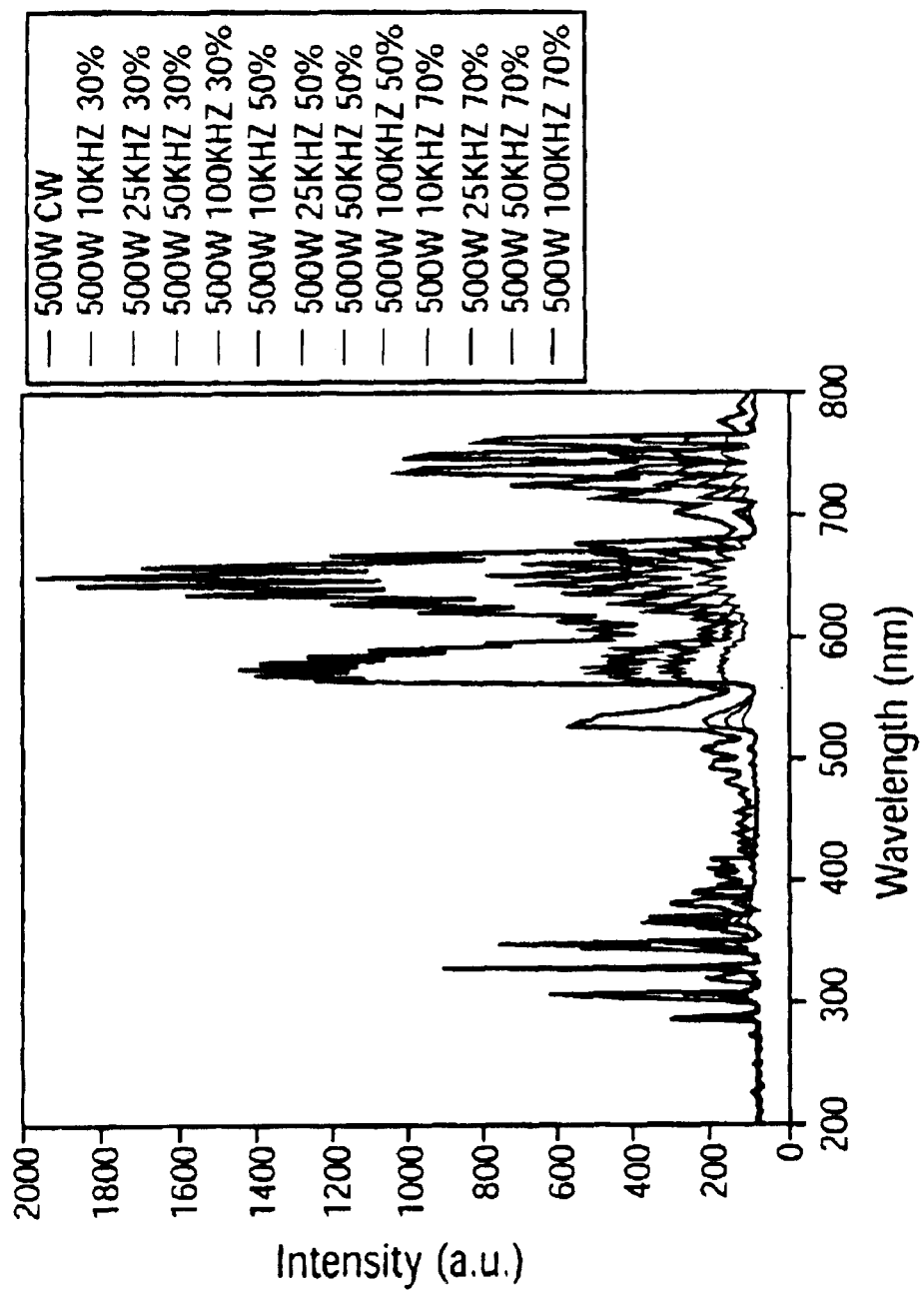
FIG. 17 is a graph illustrating optical emissions spectra for 500 W peak power at various pulsing frequencies and duty cycles.
Figure 18:
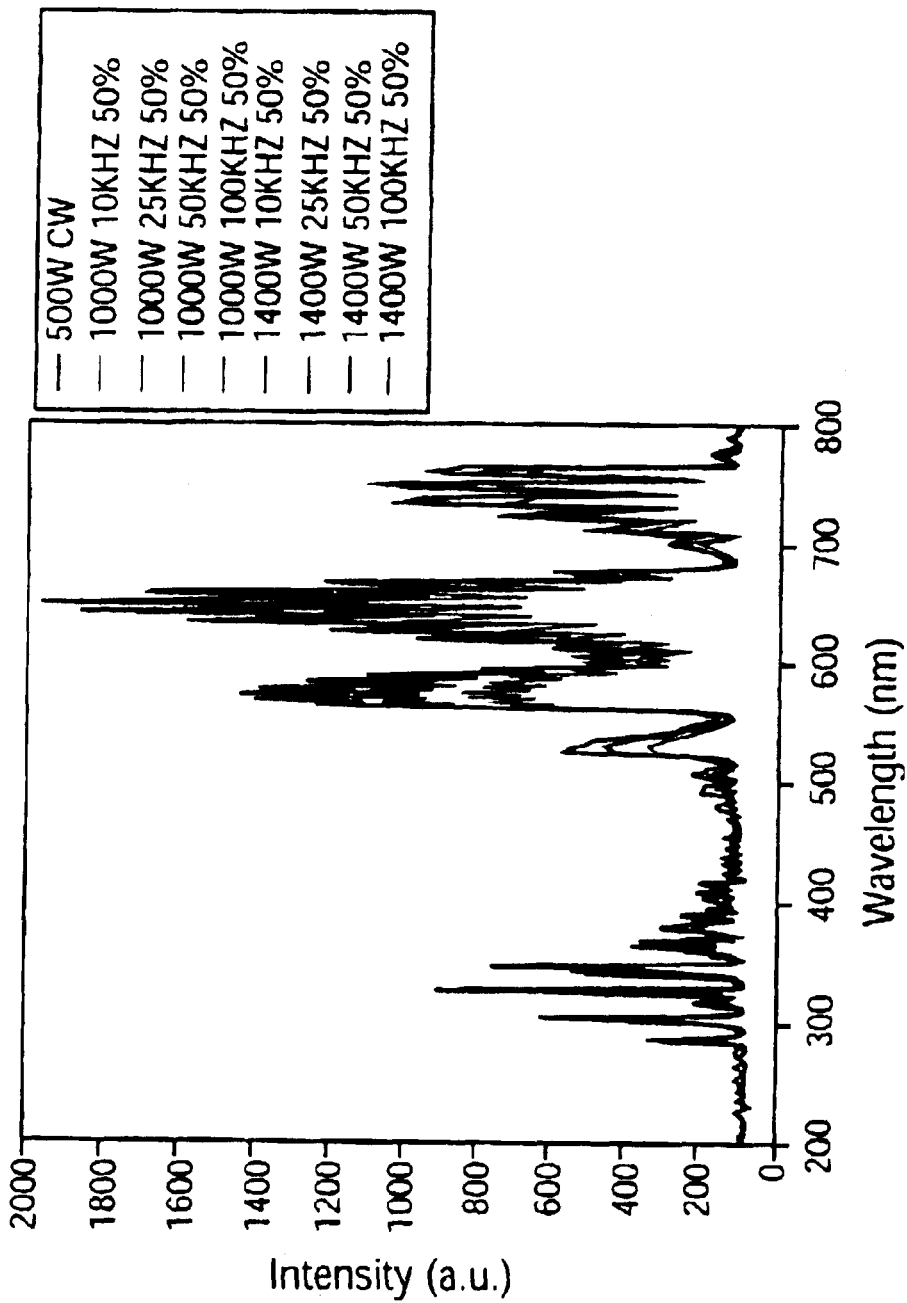
FIG. 18 illustrates optical emission spectra for a 50% duty cycle at various pulsing frequencies and peak powers.
Figure 19:
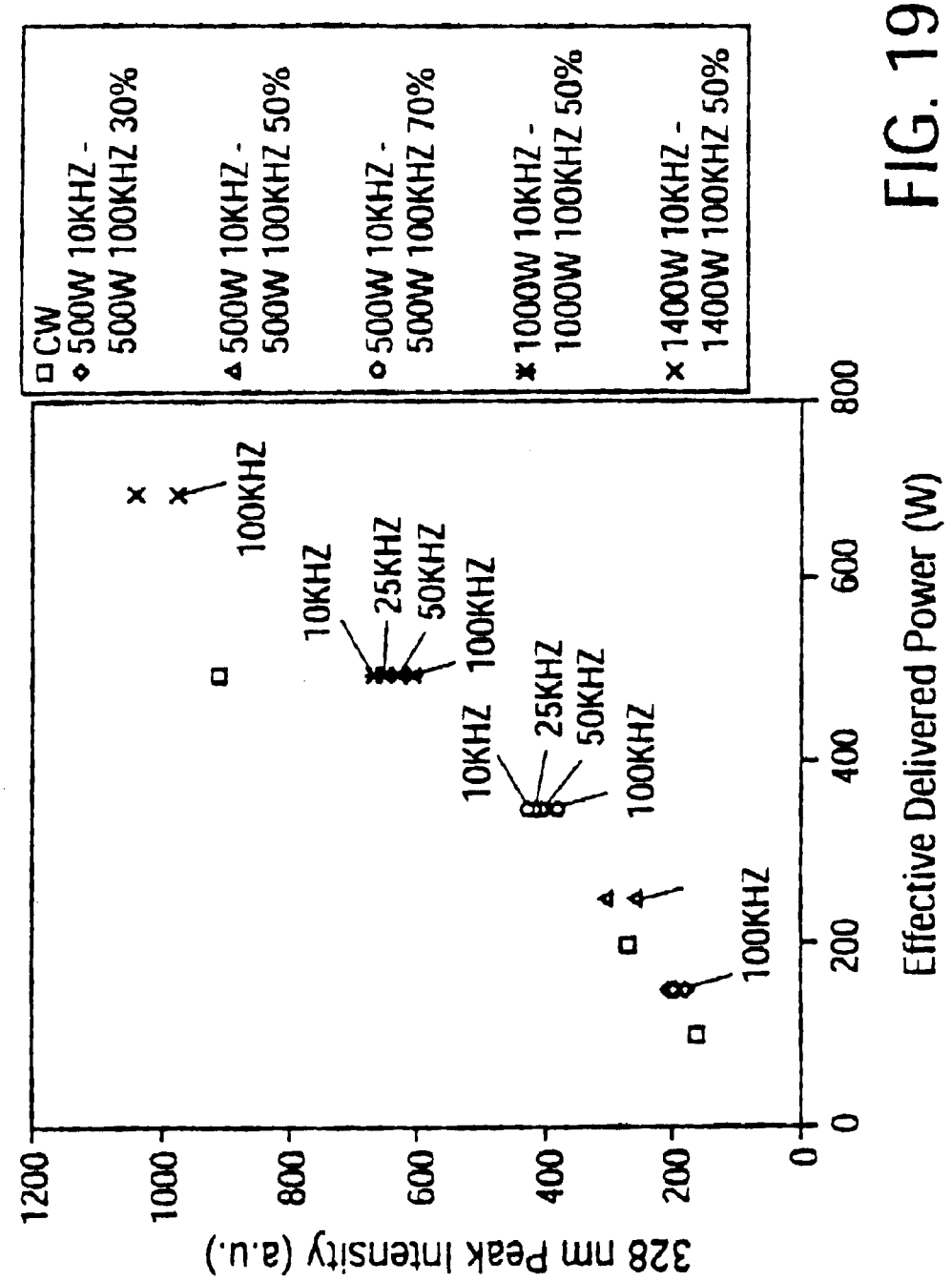
FIG. 19 is a graph of effective power versus peak intensity.
Figure 20:
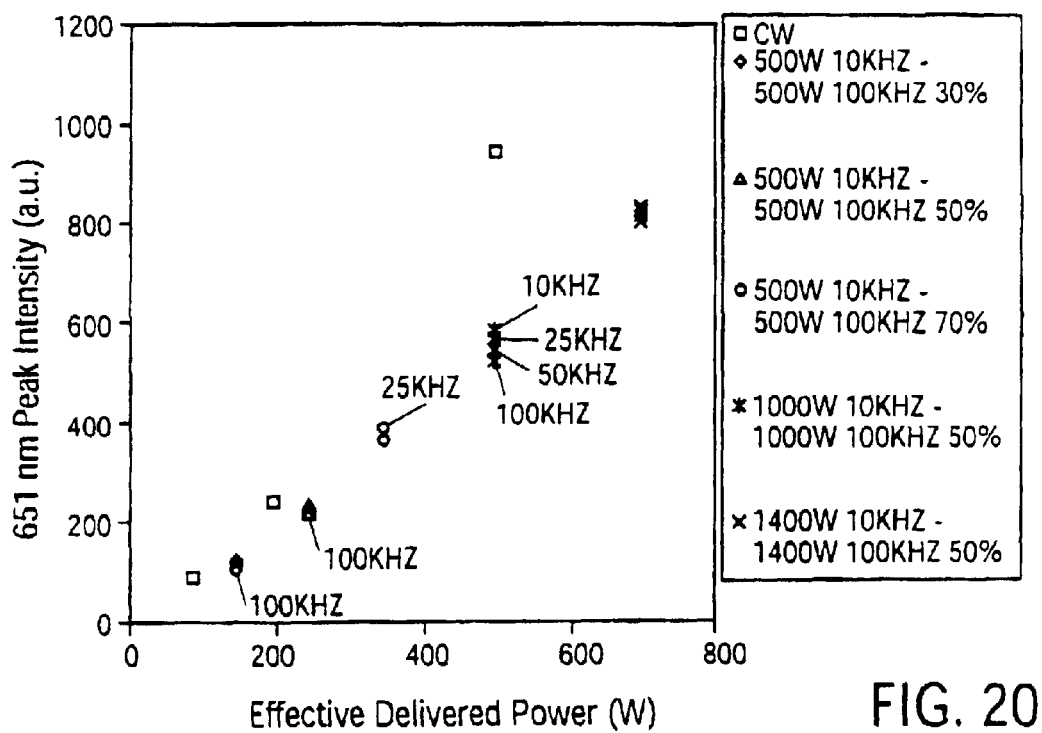
FIG. 20 is another graph of effective power versus peak intensity.

In FIGS. 17 and 18, optical emission spectra are captured with an optical emission spectrometer. As one increases the duty cycle at fixed-peak RF power (500 W), the spectra approach the 500 W continuous power spectra (top line), as can be seen in FIG. 17. Pulsing frequency has a small effect on the observed intensity. FIG. 18 shows that the pulsed RF emission level can be restored to the continuous-power emission level (top line) by increasing peak RF power. Again, the emission is relatively insensitive to pulsing frequency.

FIGS. 13 to 16 indicate that on-wafer nitrogen incorporation similar to the incorporation of continuous RF power is possible with pulsed-RF plasmas. FIGS. 17 and 18 indicate that plasmas of similar ion density to continuous-RF power plasmas can be achieved with pulsed-RF power. These data, coupled with the effect of pulsed-RF power to reduce the electron temperature and plasma potential relative to continuous power, indicate that the pulsing of RF power provides a method for incorporation of nitrogen into gate dielectric oxides at lower energy levels. While incorporating the same amount of nitrogen in the oxide, nitrogen ions in the pulsed plasmas are accelerated into the wafer less than ions in the continuous-power plasmas because of the lower plasma potentials of the pulsed plasmas. Because of this reduced acceleration, the nitrogen will not penetrate as far into the oxide and the underlying silicon.

The simulation of ion implantation into silicon, specifically into Si(100), at various ion energies (10 eV to 30 eV), through a thin oxide layer shows less penetration for lower energy, as can be readily expected. Achieving nitrogen incorporation in such a low-energy fashion with the pulsed-nitrogen plasmas may provide for an improved dielectric that will lead directly to improvements in transistor performance.

In another embodiment of the invention, a nitrogen-containing plasma may be generated in a processing chamber via an ionizing source in communication with the processing chamber. The nitrogen-containing plasma may be used in a transistor gate nitridation process, i.e., the nitrogen-containing plasma may be used to nitridate a transistor gate dielectric layer. The ionizing source may, for example, include an inductive coil-type antenna configuration, as generally discussed above, a slotted line microwave-type ionizing source, which is also generally known as a radial line antenna source, an electronic cyclotron resonance source (ECR source), magnetron or modified magnetron-type sources, or other ionizing sources that may generally be used to facilitate plasma generation in a processing chamber. Further, in the present embodiment of the invention, the nitrogen-containing plasma may be controlled via a plasma-pulsing sequence to generate lower electron temperatures than provided by conventional plasma processing chambers. Specifically, the pulsed plasma control provided by the present embodiment of the invention may be used to specifically control the mean energy of the constituents of the plasma, which is generally referred to herein as the electron temperature. The control over the plasma is configured to provide a lower electron temperature, which, for example, may be used in gate nitridation processes to improve device characteristics, i.e., to provide less degradation in transconductance and improved channel mobility in gate dielectric-type devices.

The plasma pulsing sequence of the present invention generally operates to energize the nitrogen-containing plasma for a short period of time, and then allow the plasma to relax or dissipate for a period of time. The dissipation time period allows the electron temperature to decrease, while maintaining the nitrogen-containing plasma. Thus, embodiments of the invention will generally operate to pulse the ionizing source energy in an amount sufficient to maintain the plasma through the upcoming off or relax time, i.e., the pulse-on time is calculated to provide sufficient energy to the plasma to maintain the plasma through an upcoming off or relax time where energy is not being provided to the plasma. During the off or relax portion of the ionizing source pulses, the electrons in the plasma diffuse freely. However, it is known that how fast the electrons diffuse is directly related to the electron energy. Therefore, the higher energy electrons, i.e., the hotter electrons, will diffuse more rapidly out of the plasma than electrons having lower energy, which results in a lower mean energy of the constituents of the plasma, i.e., a lower electron temperature and a lower-temperature plasma.

Therefore, the duty cycle of the pulses provided by the ionized source also has an effect upon the mean temperature of the constituents of the plasma. In particular, greater duty cycles, which correspond to longer pulse-on times, generate hotter plasmas, as the electrons in the plasma are being excited for a longer period of time during the pulse-on time. Therefore, embodiments of the invention generally contemplate that the duty cycle of the plasma ionizing pulses may be between about 5% and about 90%. More particularly, the duty cycle may be between about 10% and about 80%, between about 25% and about 60%, and between about 30% and about 50%, for example, in order to generate the desired mean temperature of the constituents of the plasma. Further, embodiments of the invention contemplate that the ionized plasma source may be used in a pseudo-pulsing manner to control the electron temperature. For example, as an alternative to pulsing, the output of the ionized source may be varied between about 5% and about 100% to control the plasma temperature. Generally, embodiments of the invention contemplate optimizing the on and off time of the pulse to control the electron temperature.

Figure 21:
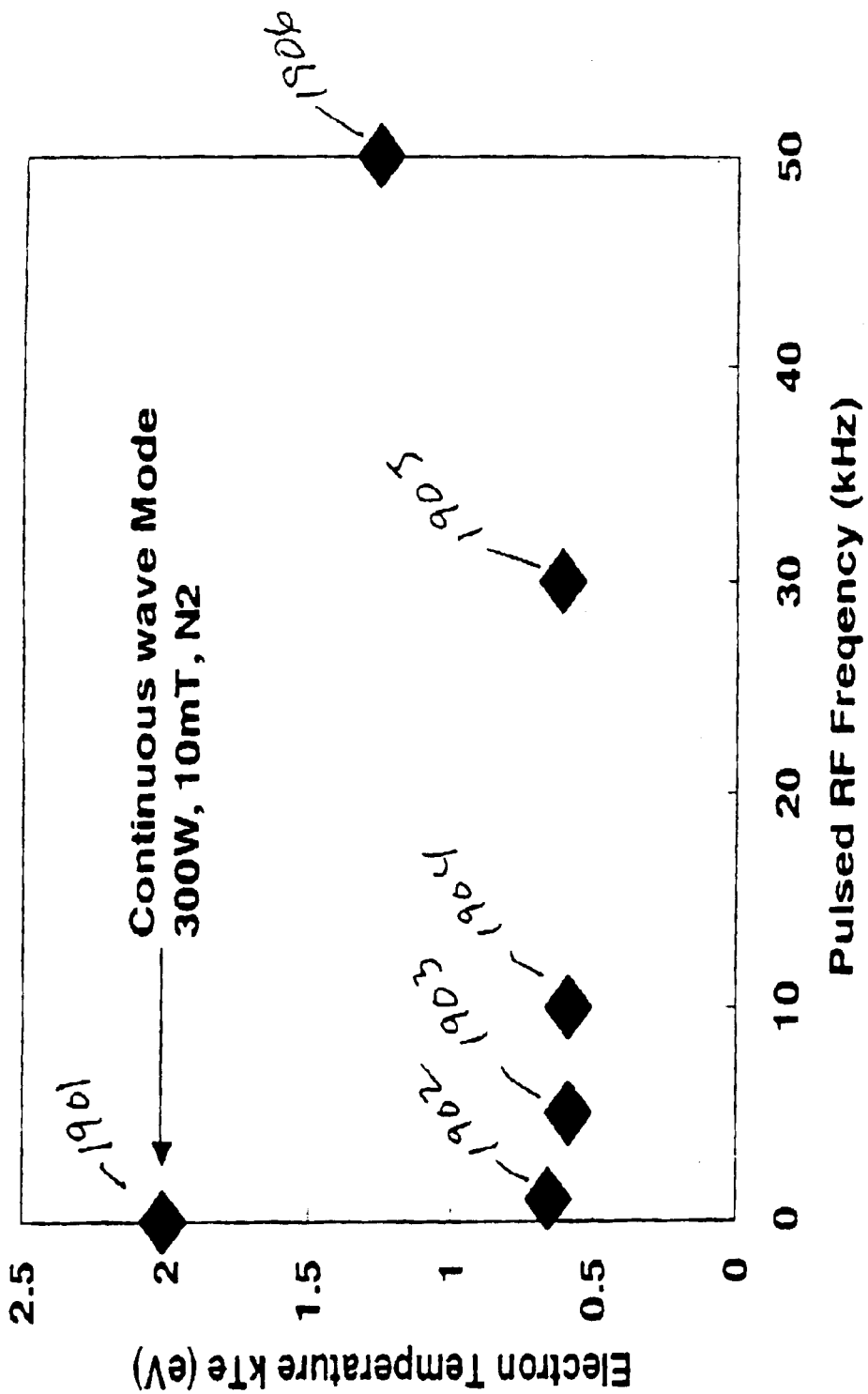
FIG. 21 is a graph of the electron temperature versus the frequency of a power supplied to an ionizing source.

As an example of an embodiment of the present invention, FIG. 21 illustrates a plot of the electron temperature versus the pulsed RF frequency for a plasma-processing chamber utilizing an ionizing source to generate the plasma. The date was obtained using an inductive coil configuration ionizing source, as discussed above, using matched ion densities, power applications, chamber pressures, and processing gas flows. A first data point 1901 generally represents the electron temperature at the time of plasma initiation with no pulsing. At the first data point 1901, the power supplied to the ionizing source is constant and does not vary or pulse, and therefore, the electron temperature was measured to be 2 eV once the plasma was stabilized. A second data point 1902 illustrates the electron temperature of the plasma when the power to the ionizing source was pulsed at a frequency of 500 kHz. At this frequency, the electron temperature was measured to be approximately 0.6 eV. A third data point 1903 illustrates the electron temperature of the plasma when the power to the ionizing source was pulsed at a frequency of 5 kHz. At this frequency, the electron temperature was measured to be approximately 0.55 eV. A fourth data point 1904 illustrates the electron temperature of the plasma when the power to the ionizing source was pulsed at a frequency of 10 kHz. At this frequency, the electron temperature was measured to be approximately 0.55 eV. A fourth data point 1904 illustrates the electron temperature of the plasma when the power to the ionizing source was pulsed at a frequency of 10 kHz. At this frequency, the electron temperature was measured to be approximately 0.55 eV. A fifth data point 1905 illustrates the electron temperature of the plasma when the power to the ionizing source was pulsed at a frequency of 30 kHz. At this frequency, the electron temperature was measured to be approximately 0.55 eV. A sixth data point 1906 illustrates the electron temperature of the plasma when the power to the ionizing source was pulsed at a frequency of 50 kHz. At this frequency, the electron temperature was measured to be approximately 1.25 eV.

Therefore, FIG. 21 generally illustrates that the implementation of a pulsed plasma operates to control the electron temperature of the plasma. Further, FIG. 21 generally illustrates that the frequency of the power applied to the ionizing source may be varied between about 500 Hz and about 50 kHz, while still maintaining an electron temperature of less than 0.6 eV ("broadcasting problems" occur at approximately 100 kHz). Further still, when the frequency is increased up to about 50 kHz, the electron temperature is still less than about 1.25 eV. As such, embodiments of the present invention generally use an ionizing source to pulse the plasma in order to control the electron temperature of the plasma, and more specifically, in order to maintain the electron temperature of the plasma at less than about 0.7 eV. In particular, embodiments of the present invention provide an ionizing source configured to pulse a plasma in a processing chamber at a frequency of between about 1 kHz and about 30 kHz, while maintaining an electron temperature of less than about 0.6 eV. However, it is noted that although the data points in FIG. 21 were obtained using specific parameters, i.e., RF power, pressure, gas flow, etc., the relationship between the electron temperature using continuous-wave plasma and the electron temperature using a pulsed plasma is such that the electron temperature for the pulsed plasma is always less than the electron temperature for a continuous-wave plasma, regardless of the ancillary parameters.

Figure 22:
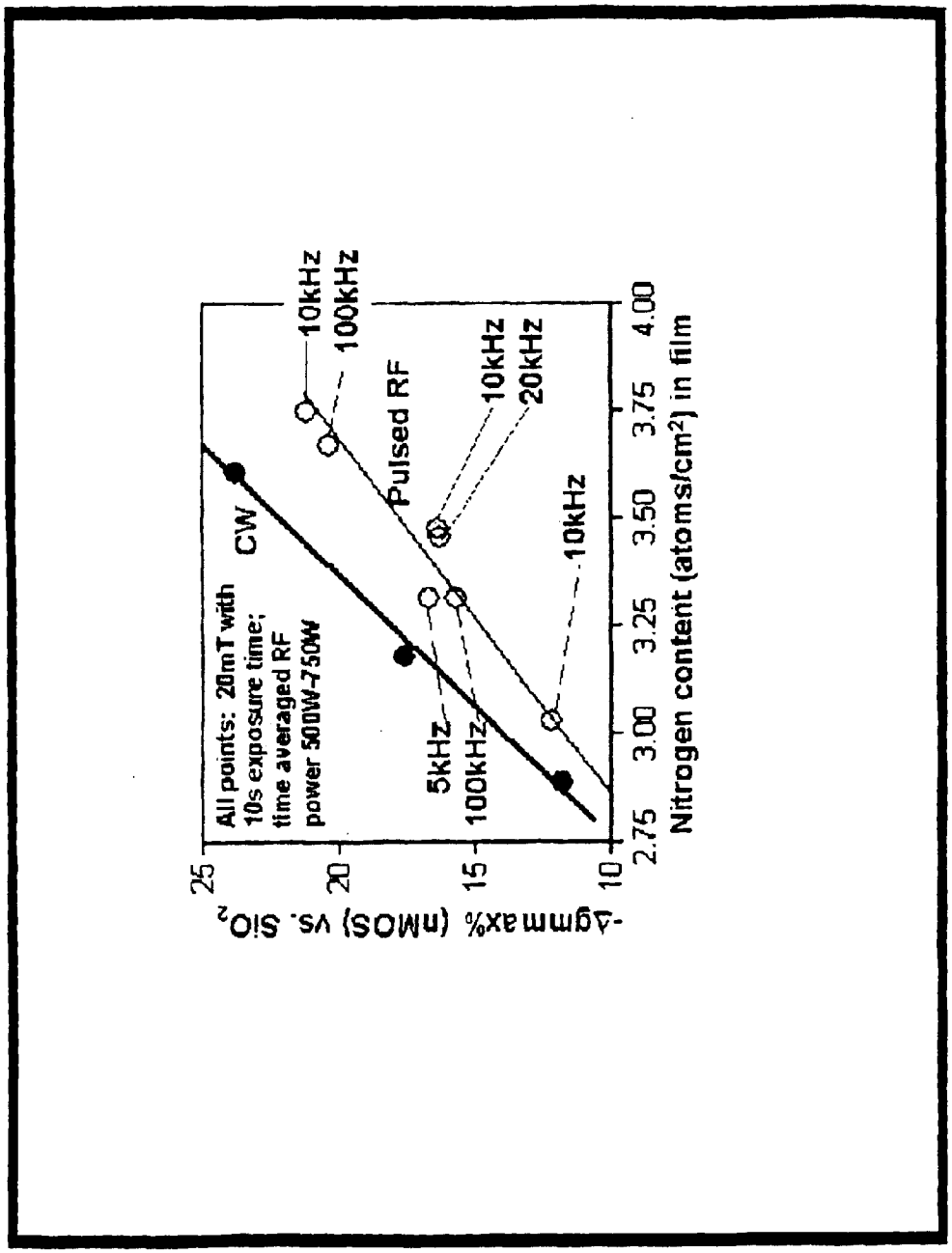
FIG. 22 is a graph of the gate transconductance versus nitrogen content for an NMOS device.

FIG. 22 illustrates data representative of a change in the maximum channel transconductance (gmmax) as a function of the percentage of nitrogen in the film. It should be noted that in transistor fabrication the lowest possible change or shift transconductance is desired; however, nitrogen is generally introduced into the transistor fabrication process, as it is known to reduce transistor gate leakage, prevent diffusion of boron from the polysilicon gate electrode, and reduce the electrical thickness, which provides improved off-state control. Therefore, although the maximum channel transconductance shift may be reduced by eliminating the nitrogen, the elimination of the nitrogen would adversely affect the gate leakage, diffusion, and the off-state control dramatically. As such, the present invention operates to reduce the maximum channel transconductance shift, while maintaining the nitrogen and the benefits provided by the nitrogen content.

Specifically, FIG. 22 illustrates the difference in maximum channel transconductance for a nitrogen-containing plasma generated via a continuous-wave configuration versus an ionizing source configured to pulse the nitrogen-containing plasma. Each of the data points for the continuous-wave configuration and the ionizing source configured to pulse the plasma were collected using matching pressures, powers, durations, and duty cycles (50%), as indicated by the graph legend. For example, data points 2001 represent the relationship between the maximum channel transconductance shift and the nitrogen percentage for a continuous-wave configuration. Data points 2001 illustrate a maximum channel transconductance shift of between about 18.5 and about 19.5 for a nitrogen content of about 12.8 percent. Data points 2002, which generally represent an ionized source used to pulse the nitrogen-containing plasma at a frequency of about 5 kHz, generally illustrate maximum channel transconductance shift values between about 17.5 and about 18.25 and a nitrogen content of about 13.2 percent. Data points 2003, which generally represent an ionized source used to pulse the nitrogen-containing plasma at a frequency of about 10 kHz, generally illustrate maximum channel transconductance shift values between about 18.0 and 18.25 and a nitrogen content of about 13.9 percent. Data points 2004, which generally represent an ionized source used to pulse the nitrogen-containing plasma at a frequency of about 20 kHz, generally illustrate maximum channel transconductance shift values between about 17.25 and 17.75 and a nitrogen content of about 13.8 percent. Data points 2005, which generally represent an ionized source used to pulse the nitrogen-containing plasma at a frequency of about 100 kHz, generally illustrate maximum channel transconductance shift values between about 16.25 and 17.0 and a nitrogen content of about 13.3 percent. Generally, the data points utilizing the ionized source configured to pulse the nitrogen-containing plasma, i.e., data points 2002, 2003, 2004, and 2005, provide improved maximum channel transconductance characteristics over nitrogen-containing plasmas generated via a continuous wave-type configuration.

Figure 23:
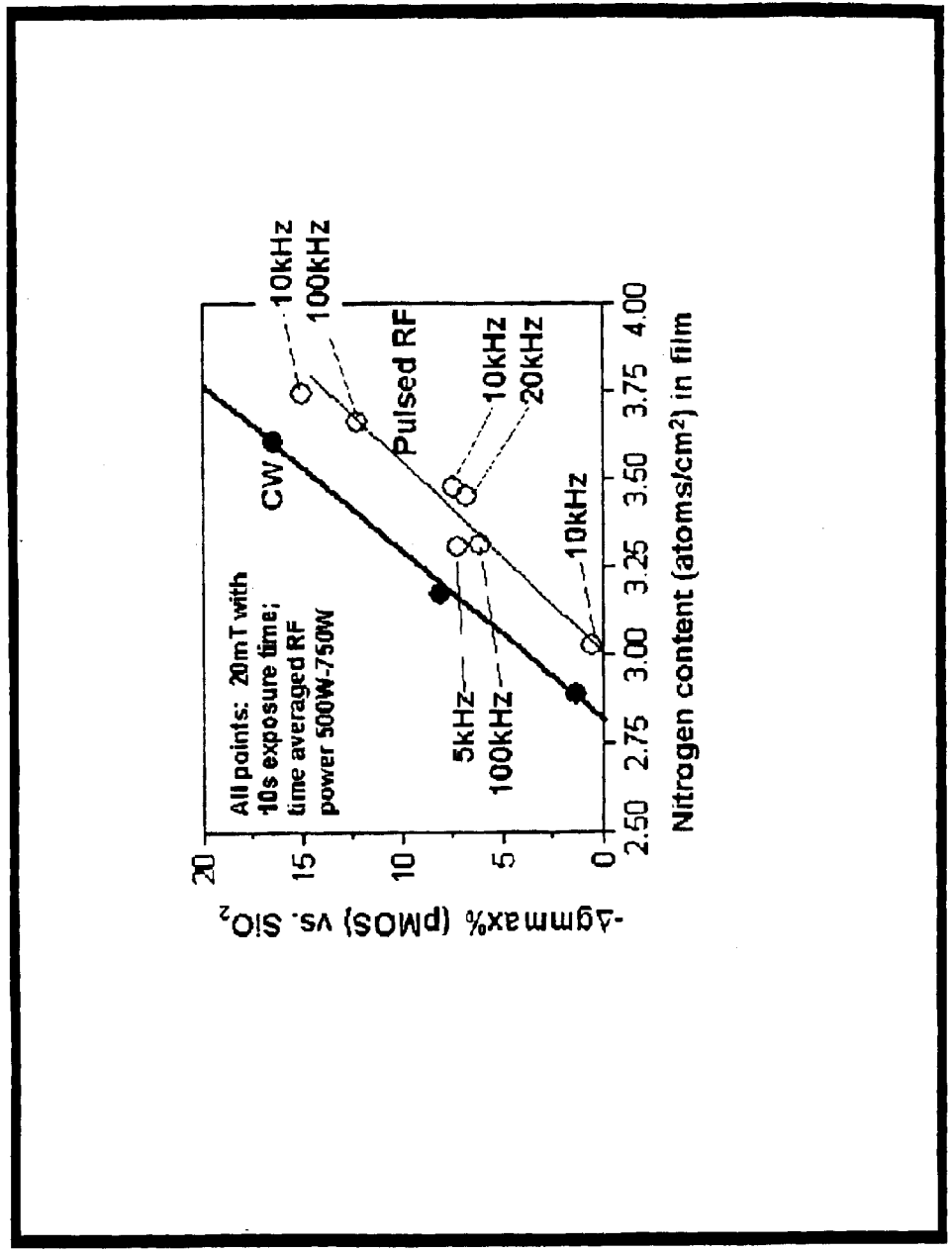
FIG. 23 is a graph of the gate transconductance versus nitrogen content for a PMOS device.

Similar improvements to the improvements in the change in gmmax represented in FIG. 22 are also obtained for threshold voltage shift and saturation drain current. FIG. 22 illustrates results for an NMOS transistor. As illustrated in FIG. 23, similar improvements can be obtained for a PMOS transistor.

It should be noted that although nitrogen incorporation into a thin gate silicon dioxide has been described, the described processes may have applications for nitrogen incorporation in other gate dielectric materials, in particular, high-k dielectric materials such as $HfO_2$, $Hf_{1-x}$, or $SixO_2$.

Further, although pulsing of ion energy has been described with respect to an inductive coil ionizing source, another embodiment may, for example make use of a radial line slotted antenna ionizing source, a magnetron-type source, or an electron cyclotron resonance ionizing source.

While certain exemplary embodiments have been described and shown in the accompanying drawings, it is to be understood that such embodiments are merely illustrative and not restrictive of the current invention, and that this invention is not restricted to the specific constructions and arrangements shown and described since modifications may occur to those ordinarily skilled in the art.

What is claimed is:

1. A method of forming a nitride gate dielectric layer, comprising:
generating a nitrogen-containing plasma in a processing chamber via introduction of a nitrogen-containing processing gas or gas mixtures into the processing chamber and the application of an ionizing energy to the processing gas; and
pulsing the ionizing energy to maintain a mean temperature of electrons in the nitrogen-containing plasma of less than about 0.7 eV.

2. The method of claim 1, wherein pulsing the ionizing energy comprises at least one of varying a duty cycle of the pulses between about 5% and about 50% and varying an ionizing power between about 5% and about 100%.

3. The method of claim 1, wherein pulsing the ionizing energy comprises using at least one of an inductive coil ionizing source, a radial line slotted antenna ionizing source, modified magnetron-type sources, and an electron cyclotron resonance ionizing source.

4. A method of controlling a mean energy of constituents of a nitrogen-containing plasma used to nitridate a gate dielectric layer, comprising pulsing an ionizing source used to maintain the nitrogen-containing plasma for a first duration sufficient to energize the nitrogen-containing plasma and turning off the ionizing source; and
allowing the constituents of the nitrogen-containing plasma to dissipate for a second duration, and the second duration being calculated to generate an electron temperature of the nitrogen-containing plasma of less than about 0.7 eV.

5. The method of claim 4, wherein pulsing the ionizing energy comprises at least one of varying a duty cycle of the pulses between about 5% and about 50% and varying an ionizing power between about 5% and about 100%.

6. The method of claim 4, wherein pulsing the ionizing energy comprises using at least one of an inductive coil ionizing source, a radial line slotted antenna ionizing source, modified magnetron-type sources, and an electron cyclotron resonance ionizing source.

7. A method of processing a substrate, comprising:
inserting the substrate into a processing chamber;
generating a nitrogen-containing plasma in a processing chamber via introduction of a nitrogen-containing processing gas or gas mixtures into the processing chamber and the application of an ionizing energy to the processing gas;
pulsing the ionizing energy to maintain a mean temperature of electrons in the nitrogen-containing plasma of less than about 0.7 eV, nitrogen of the plasma incorporating into a gate dielectric layer on the substrate; and
removing the substrate from the processing chamber.

* * * * *